US005336902A

United States Patent [19]

Nigaki et al.

[11] Patent Number: 5,336,902

[45] Date of Patent: Aug. 9, 1994

[54] SEMICONDUCTOR PHOTO-ELECTRON-EMITTING DEVICE

[75] Inventors: Minoru Nigaki; Tuneo Ihara; Toru Hirohata; Tomoko Suzuki; Kimitsugu Nakamura; Norio Asakura; Masami Yamada; Yasuharu Negi; Tomihiko Kuroyanagi; Yoshihiko Mizushima, all of Hamamatsu, Japan

[73] Assignee: Hamamatsu Photonics K.K., Hamamatsu, Japan

[21] Appl. No.: 956,283

[22] Filed: Oct. 5, 1992

[51] Int. Cl.$^5$ ........................................... H01L 29/48

[52] U.S. Cl. ....................................... 257/10; 257/11; 257/453; 257/459; 257/622; 313/542

[58] Field of Search .................. 257/10, 11, 453, 459, 257/183, 622; 313/498, 499, 500, 501, 503, 507, 505, 384, 390, 373, 542, 499, 501, 507, 523, 366, 373, 380, 385

[56] References Cited

U.S. PATENT DOCUMENTS

| | | | |
|---|---|---|---|
| 3,867,662 | 2/1975 | Endriz | 313/542 |
| 3,958,143 | 5/1976 | Bell | 313/94 |
| 4,000,503 | 12/1976 | Matare | 257/10 |
| 4,352,117 | 9/1982 | Cuomo et al. | 257/11 |
| 5,047,821 | 9/1991 | Costello et al. | 257/11 |
| 5,118,952 | 6/1992 | Sakamoto et al. | 313/542 X |

FOREIGN PATENT DOCUMENTS

| | | |
|---|---|---|
| 0259878 | 3/1988 | European Pat. Off. . |
| 0464242 | 1/1992 | European Pat. Off. . |
| 0464242A1 | 3/1992 | European Pat. Off. . |
| 2234323 | 9/1990 | Japan . |
| PCT9114283 | 9/1991 | PCT Int'l Appl. . |

OTHER PUBLICATIONS

Takeda et al., "Electrical and Optical Properties of Ag/p-InPy p-InGaAs Schoky Photodioes", *Japanese Journal of Applied Physics*, vol. 23, No. 10, Oct., 1984, pp. 1341-1344.

Kenneth Costello, Gary David, Robert Weiss and Verle Aebi, "Transferred electron photocathode with greater with 5% quantum efficiency beyond 1 micron," Varian Electro Optical Sensor Products, Palo Alto, Calif., 1990, pp. 1-11.

Yoshikazu Takeda, Shin-ichi Takigawa and Akio Sasaki, "Electrical and Optical Properties of Aq/p-InP-/p-InGaAs Schottky", Japanese Journal of Applied Physics, vol. 23, No. 10, Oct., 1984 pp. 1341-1344.

*Primary Examiner*—William Mintel

*Attorney, Agent, or Firm*—Cushman, Darby & Cushman

[57] ABSTRACT

This invention relates to a semiconductor photo-electron-emitting device for emitting photoelectrons excited from the valence band to the conduction band by incident photons on a semiconductor layer. The device includes a Schottky electrode formed on the emitting surface on a surface of the semiconductor layer, and a conductor layer formed on a surface opposite to the emitting surface. A set bias voltage is applied between the Schottky electrode and the conductor layer to accelerate photoelectrons generated by the excitation of incident photons to the emitting surface and to transfer the accelerated photoelectrons from an energy band of a smaller effective mass to an energy band of a larger effective mass.

18 Claims, 11 Drawing Sheets

SEMICONDUCTOR PHOTO-ELECTRON-EMITTING DEVICE

BACKGROUND OF THE INVENTION

1. Field of the Invention

This invention relates to a semiconductor photo-electron-emitting device which is a photodetecting device having sensitivity to light having long wavelengths.

2. Related Background Art

In the field of applying an electric field to a semiconductor photo-electron-emitting device in order to accelerate photoelectrons generated by the excitation of incident photons, there is generally an electrode having a Schottky junction formed on the semiconductor layer, and a bias voltage supplied by the electrode applying an electric field thereto. The conventional photo-electron-emitting devices, which use semiconductors, use this electron transfer effect. An example, which does not use the electron transfer effect, is Japanese Patent Laid-Open Publication No. 234323/1990. The electron transferring semiconductor photo-electron-emitting device of this invention relates to the above described electron transfer effect. A related electron transferring photo-electron-emitting device is disclosed by, e.g., R. L. Bell U.S. Pat. No. 3,958,143. In the R. L. Bell patent, a Schottky electrode is prepared by forming an Ag thin film, by vacuum evaporation, on a III–V group compound semiconductor. A bias voltage is supplied from the electrode to apply an electric field to the semiconductor layer so that photoelectrons are accelerated.

Such electron transferring photo-electron-emitting devices have structures as exemplified below. Incident photons hν are absorbed to generate photoelectrons by excitation. An ohmic electrode is formed on one side of a semiconductor layer. On the other side thereof a Schottky electrode, being formed of an Ag thin film in the shape of an island, is formed and a $Cs_2O$ layer is formed on the Schottky electrode. A bias voltage is applied between the Schottky electrode and the ohmic electrode in order to apply an electric field to the semiconductor layer. The photoelectrons generated in the semiconductor layer by the excitation are, thus, accelerated. The accelerated photoelectrons are transferred from a Γ-valley of the conduction band to a higher energy L-valley by an electron transfer effect (the so-called "Gun effect") before they arrive at the emitting surface where they are emitted into a vacuum.

But, in a photoelectronic conversion device having the above described photoelectron emitting surface, especially a reflecting photo-electron-emitting device, which admits incident photons on the side of the emitting surface, the incident photons hν are absorbed by the Schottky electrode, formed on the emitting surface, without arriving at the semiconductor layer. This results in much deterioration of the photoelectronic conversion efficiency. In view of this, in a conventional electron transferring semiconductor photo-electron-emitting device, the Schottky electrode is formed on an about 100 Å thickness thin film in order to cause incident photons hν to be efficiently absorbed. It is known that when metal is evaporated on a semiconductor layer in a thickness of about 100 Å, the metal is distributed not in a layer, but in shapes of islands. In the above described electron transferred semiconductor photo-electron-emitting device, the Schottky electrode is in the form of islands.

Photoelectrons are generated by the excitation created when incident photons hν pass through the island-shaped electrode or between islands of the electrode and are emitted into a vacuum through the $Cs_2O$ layer. Thus, an emission probability of the photoelectron depends on a film thickness of the Schottky electrode and the gaps between the islands of the electrodes. Their control is very difficult. Furthermore, gaps between the islands of the electrodes depend on the heat treatment following the evaporation. Degassing and cleaning at high temperatures are impossible. Eventually the electrode's performance as the photo-electron-emitting surface deteriorates greatly.

Thus, the Schottky electrode film thickness and the gaps between the islands of the electrode greatly influence the optical transmission of incident photons hν, and an emission probability of photoelectrons into the vacuum, which are generated by the excitation of the incident photons hν. It is difficult to fabricate a stable Schottky electrode with high reproductivity. Thus, the conventional electron transferring semiconductor photo-electron-emitting devices have not been put to practical uses.

An object of this invention is to provide an electron transferring semiconductor photo-electron-emitting device that includes a stable, heat-resistant Schottky electrode formed with a high reproducibility rate. A further object of the present invention is to provide an electron transferring semiconductor photo-electron-emitting device that has an improved transmission of incident photons and emission probability of the photons into a vacuum, whereby photodetection having a high sensitivity can be realized.

SUMMARY OF THE INVENTION

This invention relates to a semiconductor photo-electron-emitting device for accelerating photoelectrons excited from the valence band of the semiconductor layer to the conduction band thereof by incident photons, when applying an electric field, and transferring the photoelectrons to the emitting surface, whereby the photoelectrons are emitted into a vacuum. The semiconductor photo-electron-emitting device includes an electrode in a required shape for applying a bias voltage.

Patterning an electrode improves its reproducibility. At the same time, the optical transmission of incident photons on the semiconductor layer, and the emissions probability of the photoelectron into vacuum is improved.

Furthermore, the electrode has a sufficient thickness thereby making surface resistance of the electron emitting surface lower. Good linear outputs can be obtained from low to high illuminance. Temperature characteristics of the electrode are also improved. The electron emitting surface of the electrode, after being formed, can be chemically etched to clean the surface. Furthermore, the width of the electrodes can be decreased to greatly reduce dark current.

The present invention will become more fully understood from the detailed description given herein below and the accompanying drawings, which are given by way of illustration only, and thus are not to be considered as limiting the present invention.

Further scope of applicability of the present invention will become more apparent from the detailed description given hereinafter. However, it should be understood that the detailed description and specific examples, while indicating preferred embodiments of the invention, are given by way of illustration only, since various changes and modification within the spirit and scope of the invention will become apparent to those skilled in the art from this detailed description.

DESCRIPTION OF THE PREFERRED EMBODIMENTS

The semiconductor photo-electron-emitting device according to embodiments of this invention will be explained below. The embodiments will be explained by means of an electron transferring semiconductor photo-electron-emitting devices of CsO/Al/InP or others. But this invention is not limited to the embodiments and is applicable to, e.g., the material disclosed in U.S. Pat. No. 3,958,143.

Figure 1:
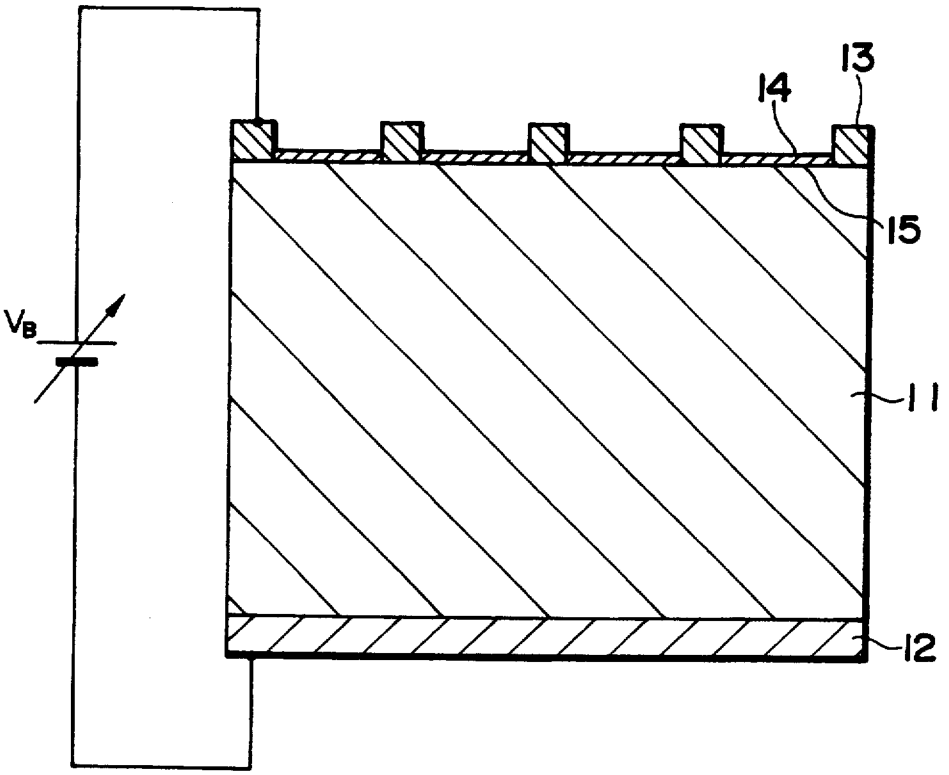
FIG. 1 is a sectional view of the semiconductor photo-electron-emitting device according to a first embodiment of this invention.

FIG. 1 is a sectional view of an electron transferring semiconductor photo-electron-emitting device according to a first embodiment of this invention. An ohmic electrode 12 is formed on the surface of one side of a p-InP semiconductor layer 11 by vacuum evaporating AuGe. On the other side of the InP semiconductor layer 11 there is formed a Schottky electrode 13. The Schottky electrode 13 is formed by vacuum evaporating Al in a film thickness of about 2000 Å, and then photolithographing the Al film into a mesh pattern of 10 μm-width and a 150 μm-interval. It is preferable that the interval of the mesh pattern of the Schottky electrode 13 is as small as possible so as to increase the electron escape probability. An optimum value of the pattern interval is available based on an emission probability of the photoelectrons into the vacuum, and a probability of generation of the Gun effect (Γ to L transfer) by an applied electric field. The optimum value is about 10 μm at a bias voltage of 5 V. The film thickness of Al of the Schottky electrode 13 is not essential to this invention and can be any thickness as long as the Schottky electrode 13 has a layer structure of an about 100 Å or more thickness and has a sufficient electric conductivity.

To make the electron transferring semiconductor photo-electron-emitting device of such structure operative, the ohmic electrode 12, of AuGe, is fixed to a metal plate by an Au wire. The wire is used to apply a bias voltage VB between the Schottky electrode 13 and the ohmic electrode 12. To install this device in a vacuum, the device is placed into a high vacuum of about $10^{-10}$ Torr, then the device is heated up to about 400° C. for degassing and cleaning. Following this, to lower an effective vacuum level, a trace of Cs and a trace of $O_2$ are deposited on the emitting surface 15, and a $Cs_2O$ layer 14 is formed.

Figure 2:
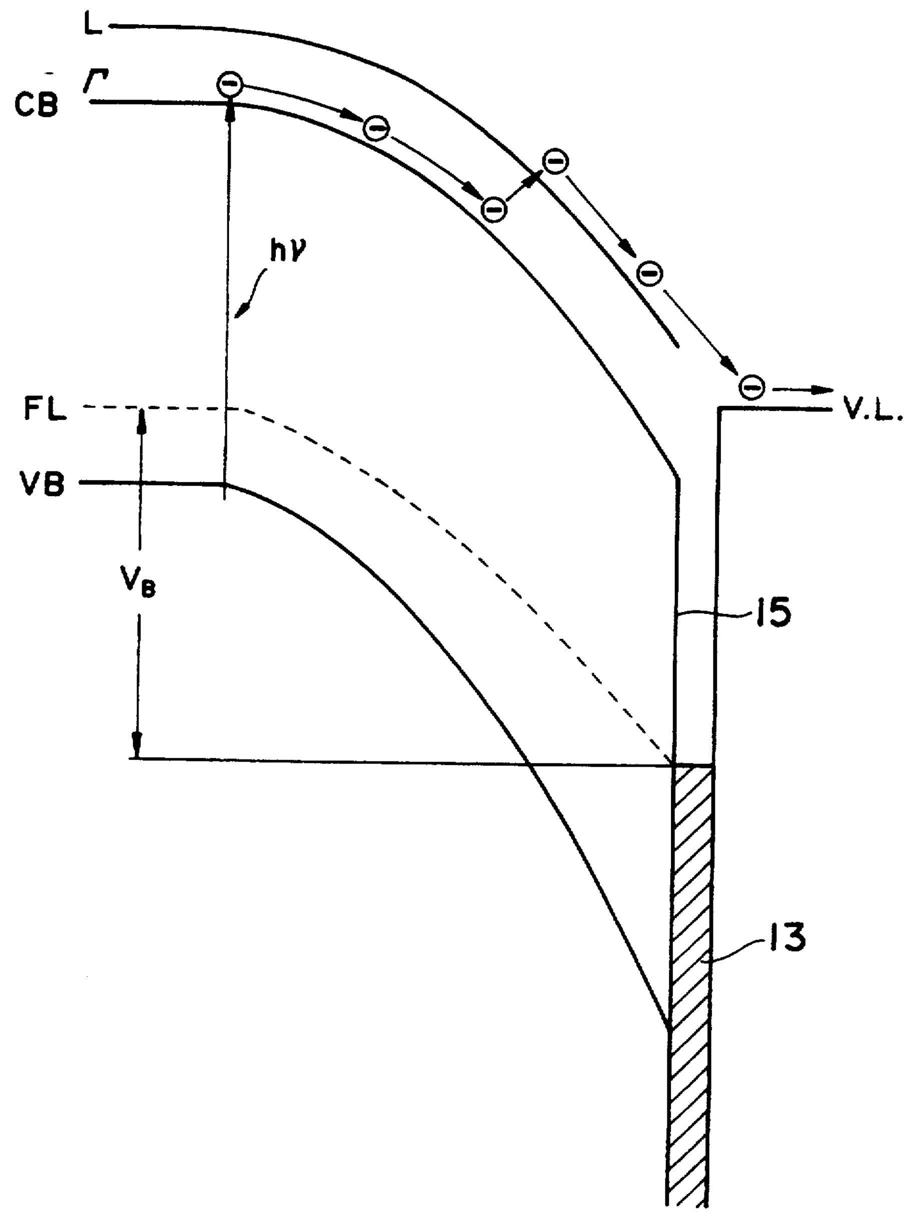
FIG. 2 is a view of the energy band of the electron transferred semiconductor photo-electron-emitting device in operation according to this invention.

FIG. 2 shows an energy band obtained when a bias voltage $V_B$ is applied to the thus formed electron transferring semiconductor photo-electron-emitting device to operate the device. In FIG. 2, CB represents a conduction band, VB represents a valence band, FL indicates a Fermi level, and V.L. represents a vacuum level. Photoelectrons are generated in the semiconductor by photons entering through the openings among the Schottky electrode 13, which in a mesh pattern on the emitting surface 15. The excited photoelectrons are accelerated by an electric field formed by the application of a bias voltage to the Schottky electrode 13 and transfer from a Γ valley of the conduction band to a L valley thereof. The excited photoelectrons arrive at the emitting surface 15. The photoelectrons, which have arrived at the emitting surface 15, pass between the Schottky electrode 13 and are emitted into the vacuum through the $Cs_2O$ layer 14.

Figure 3:
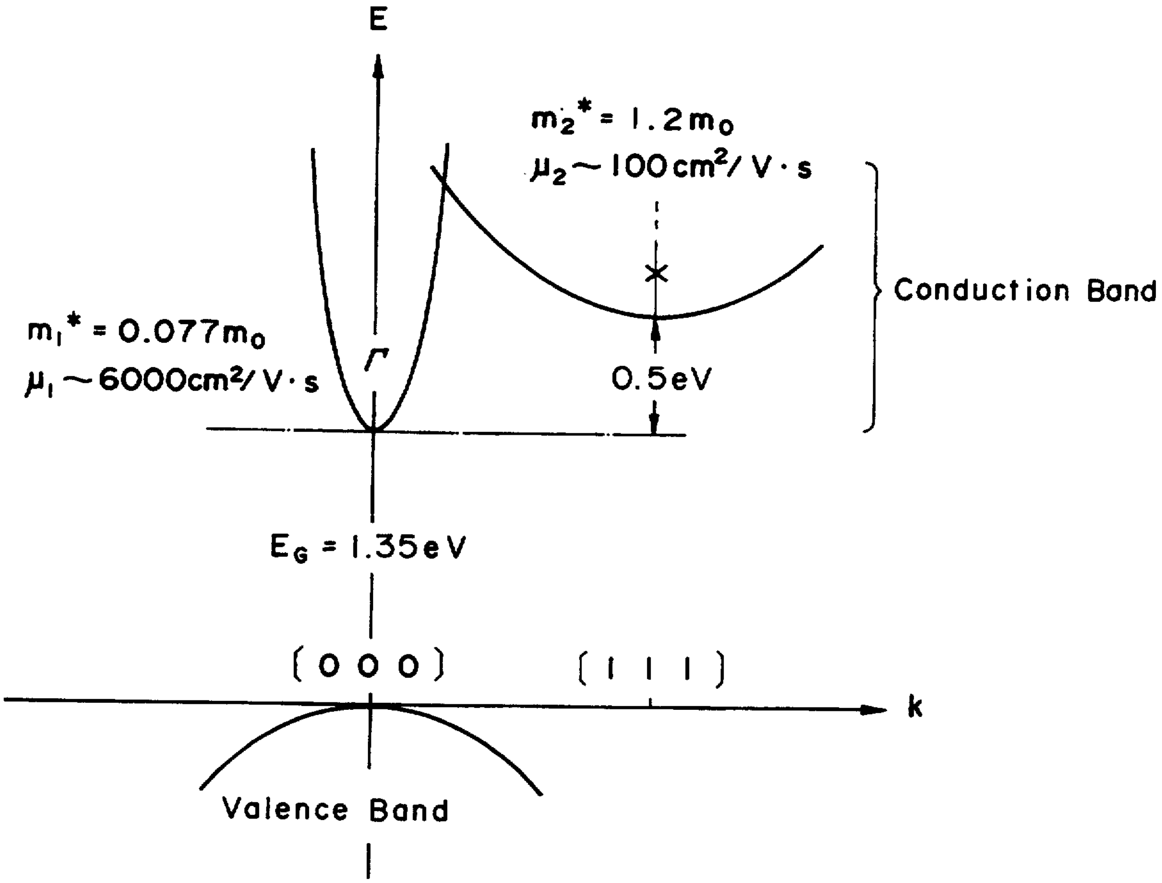
FIG. 3 is a view of an electron transfer effect in GaAs.

The electron transfer effect involved in this invention requires that the electrons, accelerated by an electric field, are transferred from a smaller effective mass energy band to a larger effective mass energy band. This electron transfer effect is the so-called Gun effect, which J. B. Gun of IBM experimentally found in GaAs and InP in 1963. This effect is explained below using InP. As shown in FIG. 3, the energy band of InP has two valleys in the conduction bands. The valley nearest to the valence band is a [000] of wave number vector (K) space, i.e., point Γ. The electrons effective mass at the point is as small as $m_1=0.077\ m_0$. The mobility at 300K is as large as above 6000 $cm^2/V.s$. In a weak electric field, most electrons are in the lower band, but as the electric field becomes stronger and exceeds a certain threshold electric field $E_{th}$ (about 3.2 kV/cm for InP), electrons begin to be transferred to the upper band due to the energy applied by the electric field. The electrons of higher energy are emitted into vacuum with higher probability, and as a result a photo-electron-emitting device having a high sensitivity is realized.

Figure 4:
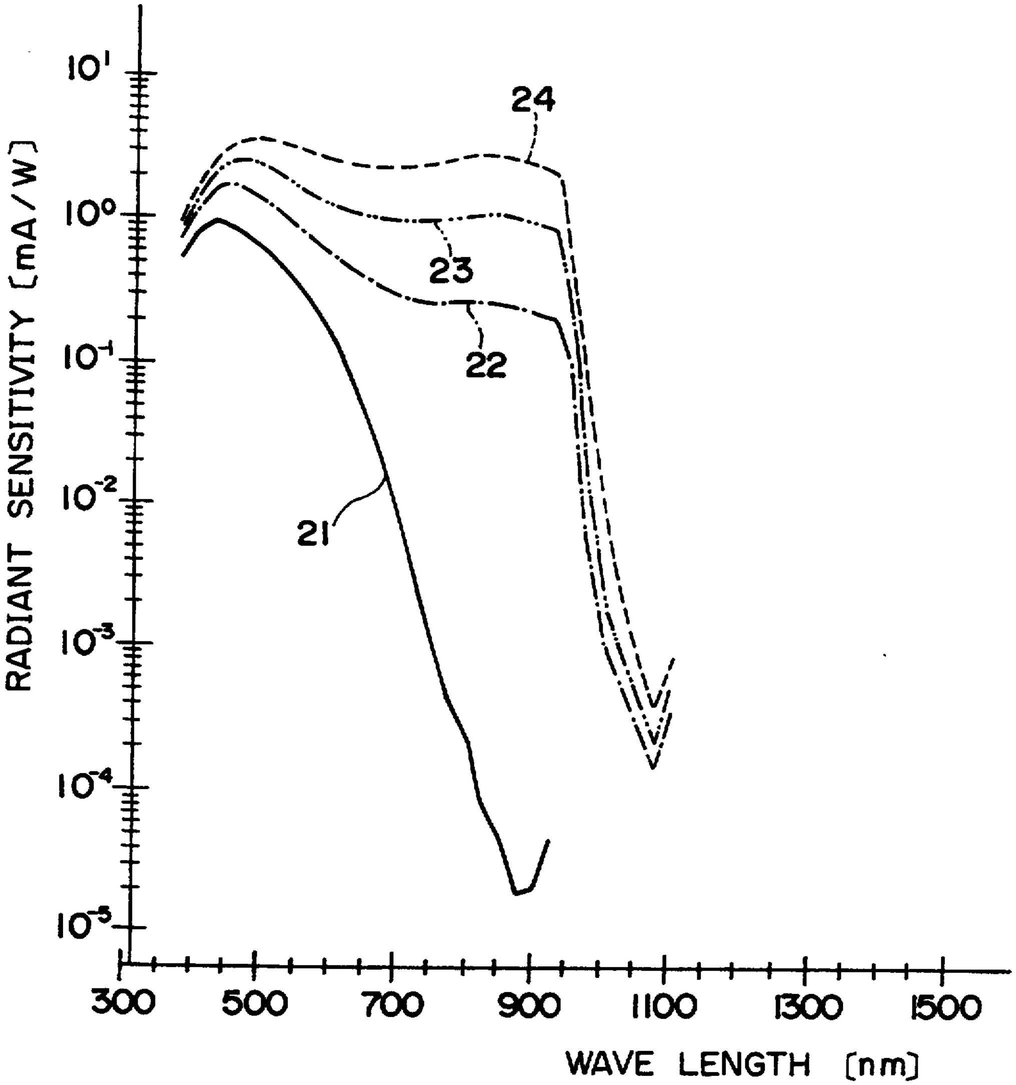
FIG. 4 is a view of a photo-electron-emitting spectral sensitivity characteristic when a bias voltage is varied.

FIG. 4 shows one example of InP photo-electron-emitting spectral sensitivity characteristics obtained at room temperature when a bias voltage $V_B$, applied to the Schottky electrode 13, was varied. In FIG. 4 wavelengths [nm] of light are represented on the horizontal axis, and radiation sensitivities [mA/W] are represented on the vertical axis. The solid line characteristic curve 21 indicates a spectral sensitivity characteristic at a bias voltage $V_B$ of 0 [V], the one-dot line characteristic curve 22 indicates a spectral sensitivity characteristic at a bias voltage $V_B$ of 1 [V], the two-dot line characteristic curve 23 indicates a spectral sensitivity characteristic at a bias voltage $V_B$ of 2 [V], and the dashed line characteristic curve 24 indicates a spectral sensitivity characteristic at a bias voltage $V_B$ of 4 [V]. It is seen from FIG. 4 that photoemission increases as a bias voltage $V_B$ is increased.

Figure 5:
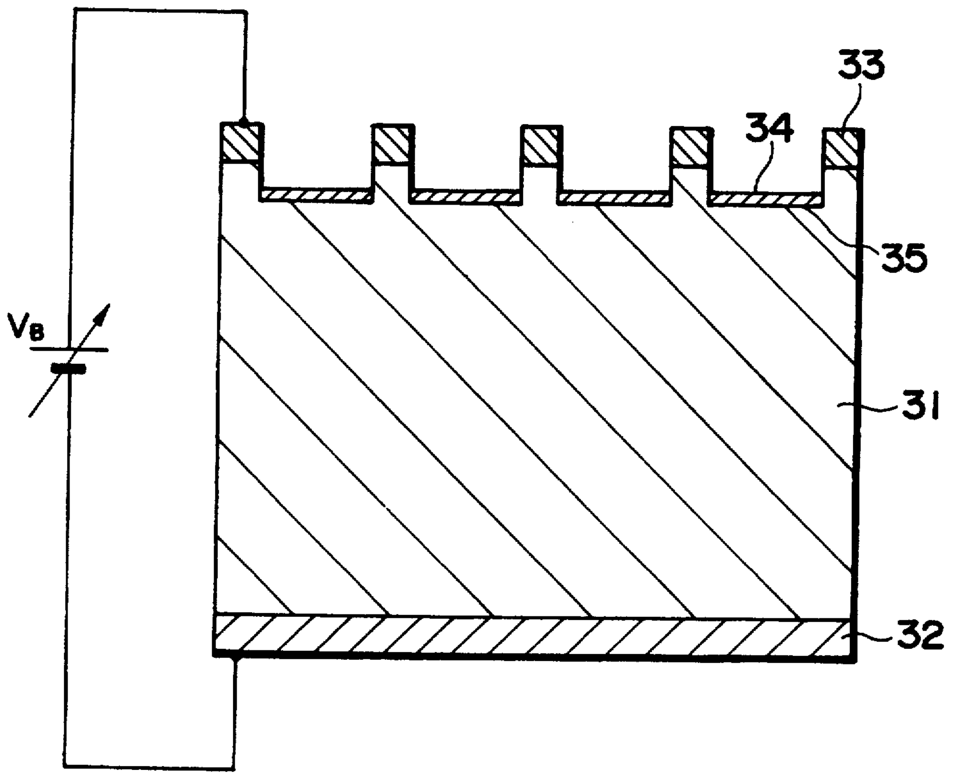
FIG. 5 is a sectional view of the semiconductor photo-electron-emitting device according to a second embodiment of this invention.
Figure 6:
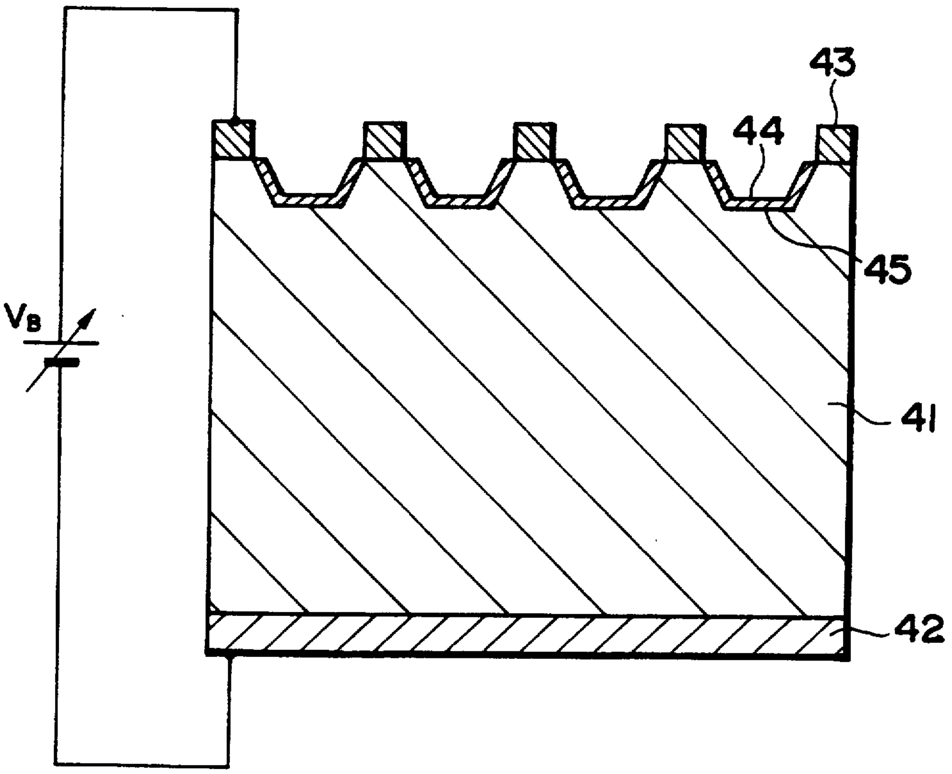
FIG. 6 is a sectional view of the semiconductor photo-electron-emitting device according to a third embodiment of the invention.
Figure 7:
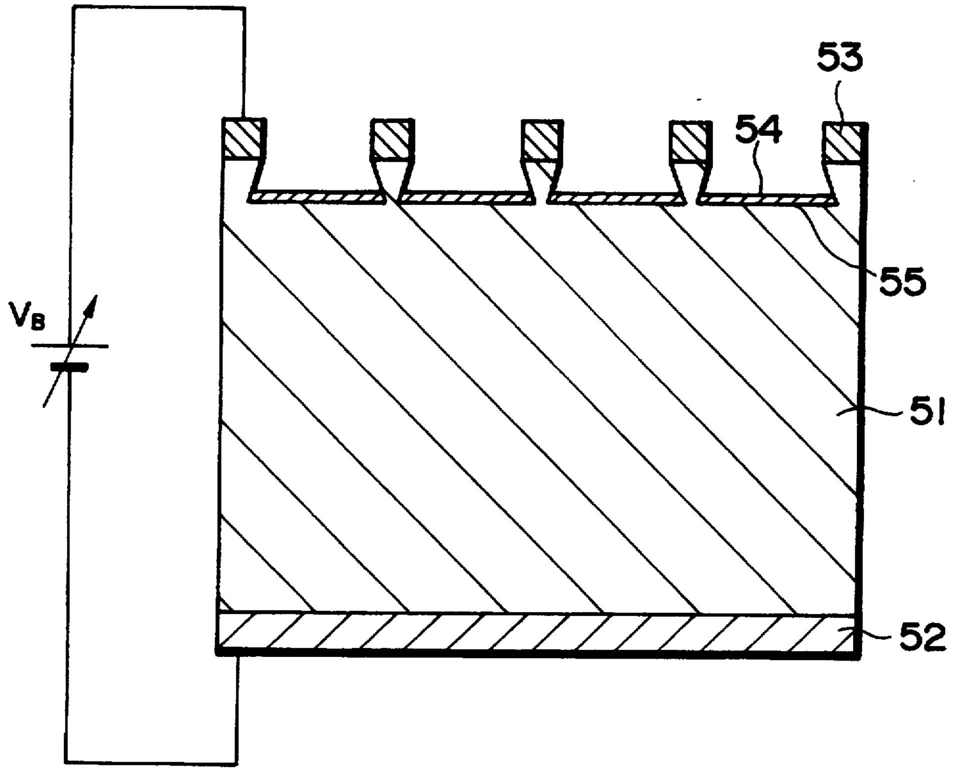
FIG. 7 is a sectional view of the semiconductor photo-electron-emitting device according to a fourth embodiment of this invention.
Figure 8:
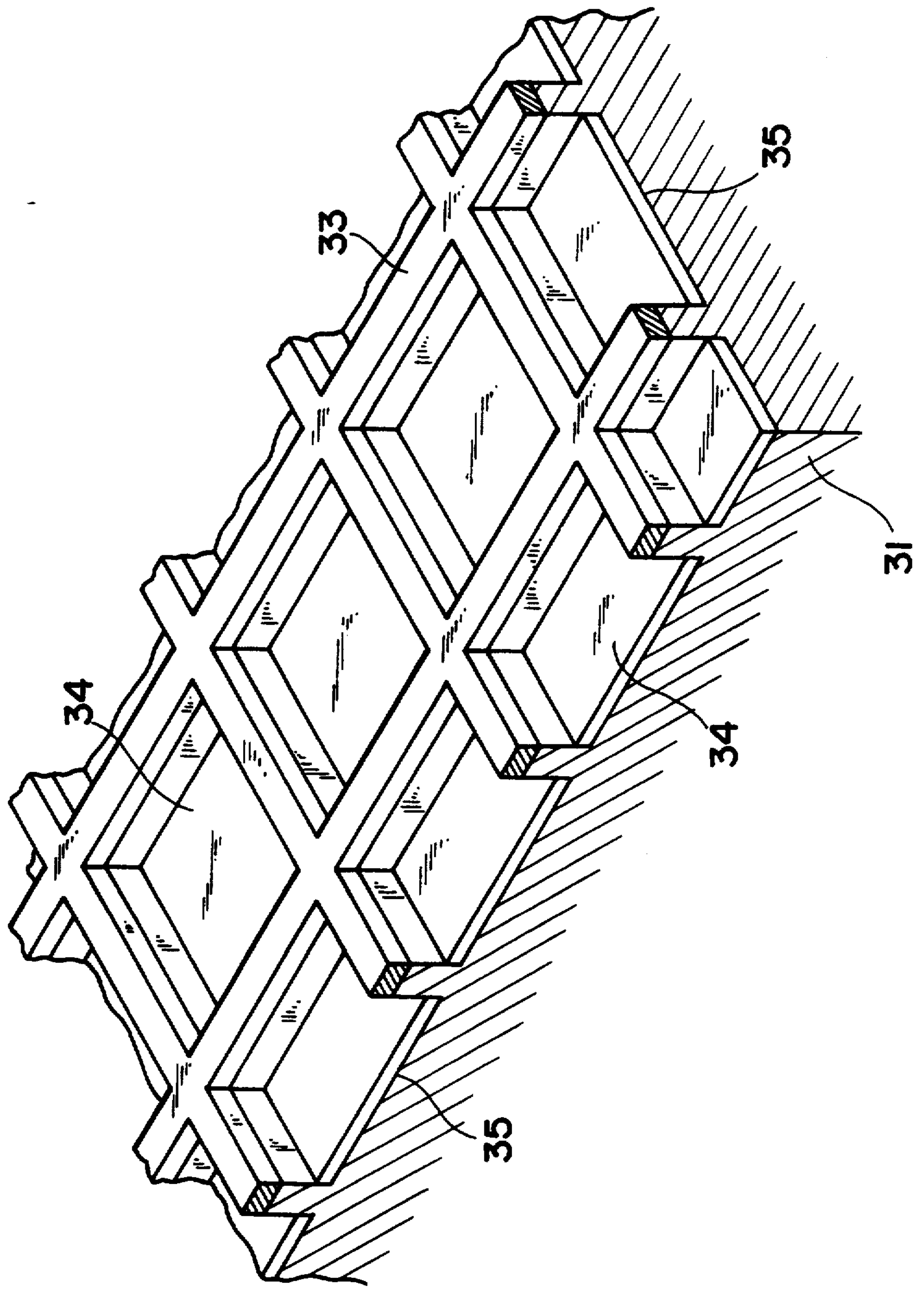
FIG. 8 is a perspective view of an embodiment of this invention using a mesh-patterned electrode.

FIGS. 5, 6 and 7 are sectional views of the electron transferring semiconductor photo-electron-emitting device according to a second, a third and a fourth embodiment of this invention. FIG. 8 is a surface structure perspective view of the photo-electron-emitting device of FIG. 5 having portion shown in sectional view. In each embodiment, a p-semiconductor layer 31, 41, 51 has one surface formed in concavities and convexities, and a Schottky electrode 33, 43, 53 is formed on the top of each of the convexities. The concavities and the convexities on the surface of the semiconductor layer 31, 41, 51 is formed by chemical etching. The Schottky electrode 33, 43, 53 is in a mesh pattern as a mask. To form a mesh electrode pattern, a suitable plane direction is selected, and the anisotropy of etching is used, whereby the three kinds of concavities and convexities as shown can be formed. Subsequently, a $Cs_2O$ layer 34, 44, 54 is formed on the emitting surface 35, 45, 55 in the same way as in the first embodiment. On the other surface of the semiconductor layer 31, 41, 51 an ohmic electrode 32, 42, 52 is formed.

In general, the electron velocity in a semiconductor is limited to a speed below $10^7$ cm/s at the room temperature due to various dispersions. In the semiconductor photo-electron-emitting device of FIG. 1, according to the first embodiment of this invention, most of the photoelectrons generated by the excitation of incident photons are absorbed by the Schottky electrode 13; few of the photoelectrons can be emitted into the vacuum. But, in each of the second, the third and the fourth embodiments of FIGS. 4, 5, and 6, the Schottky electrode is formed on the tops of the convexities on the surface of the semiconductor layer, therefore the velocity of the photons are not limited to $10^7$ cm/s and almost reach light velocity being $3\times10^{10}$ cm/s. Accordingly, the probability of the photoelectrons being absorbed by the Schottky electrode is decreased, their emission probability into the vacuum is increased, and the photosensitivity is increased.

In an actually prepared semiconductor photo-electron-emitting device having 1 μm-concavities and convexities, and a Schottky electrode located on the tops of the convexities, the emission probability of the photoelectrons into the vacuum was about double, and the photosensitivity was increased to about double.

The above described embodiments are examples of reflecting photo-electron-emitting devices in which incident photons hν are incident on the emitting surfaces 15, 35, 45, 55. This invention is not limited to this type of device. That is, in a transmitting photo-electron-emitting device, in which incident photons hν are incident on the side opposite to the emitting surface as well, the ohmic electrode 12, 32, 42, 52 is formed of a thin film or in a pattern to increase a transmission of the incident photons hν, whereby the transmitting photo-electron-emitting device can produce and exhibit the same advantageous effects as the above described embodiments.

The above described embodiments are electron transferred semiconductor photo-electron-emitting devices, but the embodiments of FIGS. 4 to 8 have one surface of the semiconductor layers formed in concavities and convexities. Furthermore, the above described embodiments have Schottky electrodes formed on the tops of the convexities. The Schottky electrons are not limited to the electron transferring type. That is, this invention is applicable to all semiconductor photo-electron-emitting devices in which photoelectrons excited by incident photons hν, from the valence band to the conductions band, are accelerated by an electric field in order to be transferred to the emitting surface and be emitted into a vacuum. Such a device can still produce the same advantageous effects as the above described embodiments.

Figure 9:
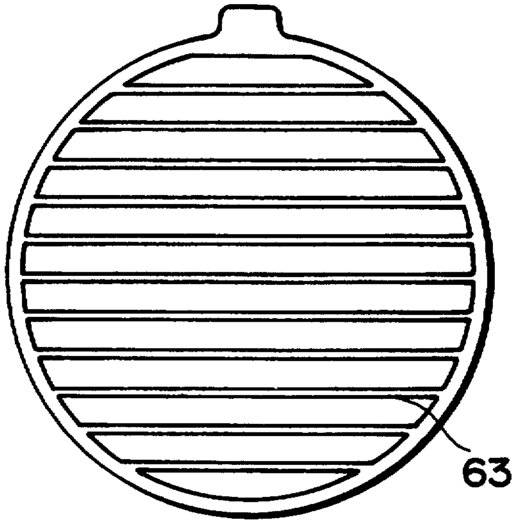
FIG. 9 is a view of a stripe-patterned electrode.
Figure 10:
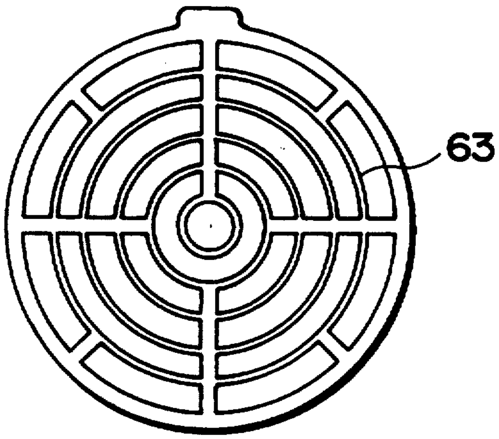
FIG. 10 is a conical circles-patterned electrode.

In the above described embodiments, the Schottky electrodes 13, 33, 43, 53 are in mesh-patterns, but are not limited to mesh patterns. As long as the Schottky electrode is formed in a pattern, which allows the semiconductor layer to be exposed in a uniform distribution, the Schottky electrode may have any pattern, such as stripe patterns, concentric patterns or others. FIG. 9 is a front view of a stripe electrode pattern. FIG. 10 is a front view of a concentric electrode pattern. These electrodes 63 are formed of the same material as in the above described embodiments, and their stripe width and strip intervals are substantially the same as in the above described embodiments. In the above described embodiments, the materials used for the Schottky electrodes is Al, but is not limited to Al. The material also can be, e.g., Ag, Au, Pt, Ti, Ni, Cr, W, WSi or their alloys.

Figure 11:
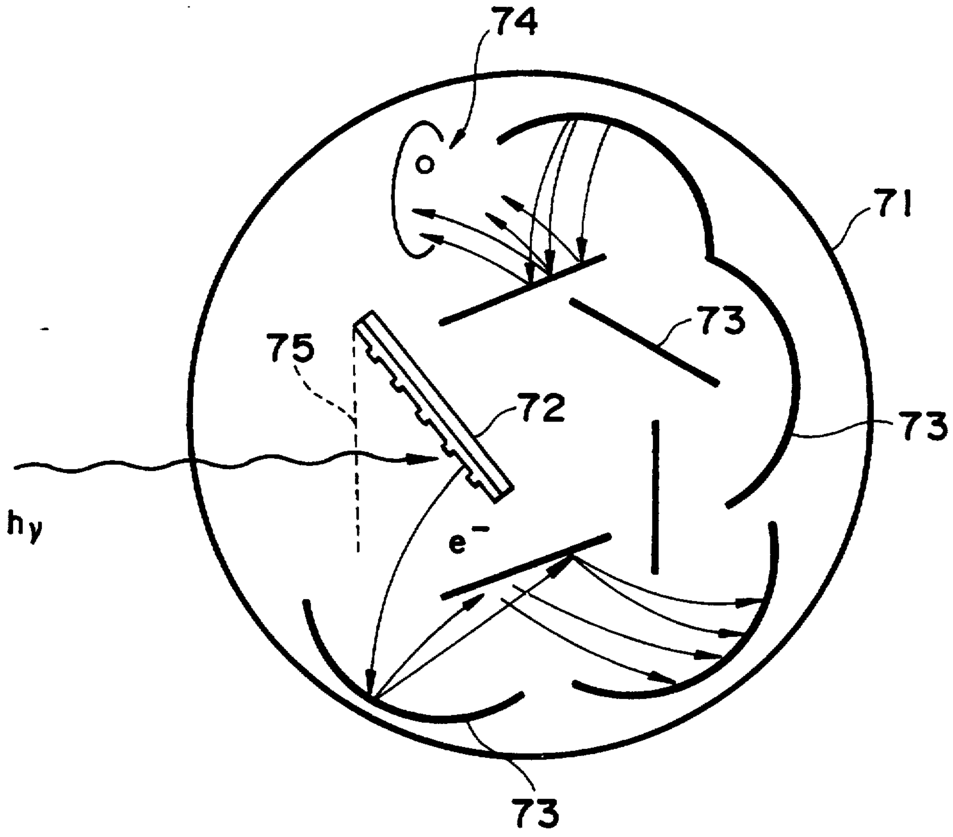
FIG. 11 is a sectional view of a side-on photomultiplier using the semiconductor photo-electron-emitting device according to one embodiment of this invention.
Figure 12:
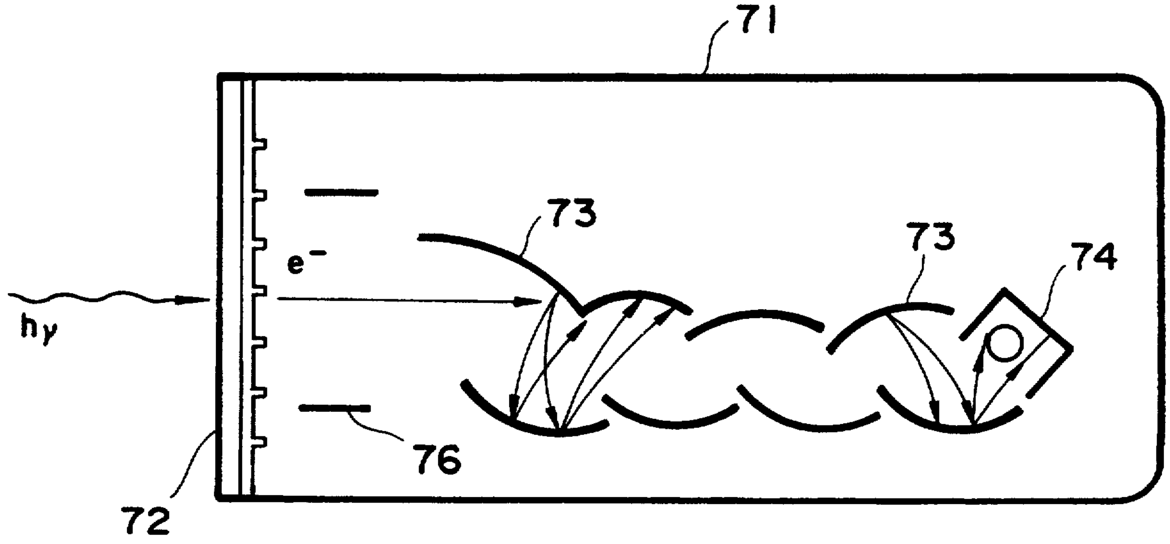
FIG. 12 is a sectional view of a head-on photomultiplier using the semiconductor photo-electron-emitting device according to one embodiment of this invention.
Figure 13:
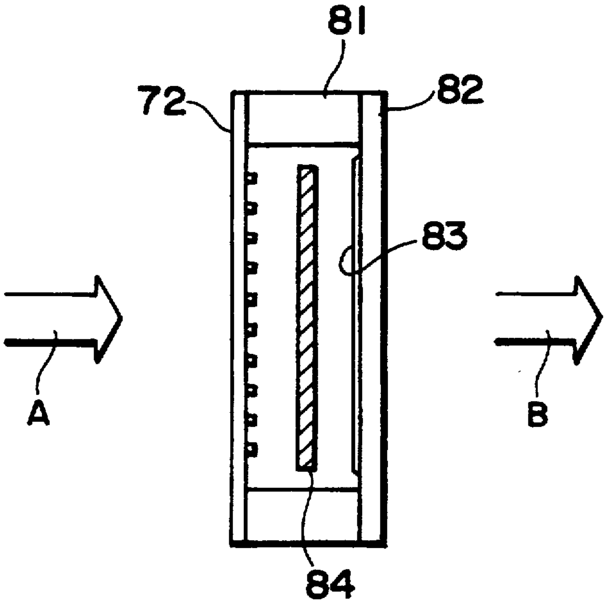
FIG. 13 is a sectional view of an image intensifier using the semiconductor photo-electron-emitting device according to one embodiment of this invention.

FIGS. 11, 12 and 13 show electron tubes using the electron transferred semiconductor photo-electron-emitting device (cathode) according to this invention. FIG. 11 is sectional view of a side-on photomultiplier using a reflecting photo-electron-emitting cathode. FIG. 12 is a sectional view of a head-on photomultiplier using the transmitting photo-electron-emitting cathode. FIG. 13 is a sectional view of an image intensifier tube using the transmitting photo-electron-emitting cathode.

In the photomultiplier of FIG. 11, the photo-electron-emitting cathode 72, a plurality of diodes 73 and an anode 74 are provided inside a vacuum vessel 71. A mesh electrode 75 is provided on the front side of the photo-electron-emitting cathode 72.

In the photomultiplier of FIG. 12, the photo-electron-emitting cathode 72 is provided on one end of a vacuum vessel 71, and a condenser electrode 76 is provided inside the vacuum vessel. In any of the photomultipliers, photoelectrons (−e) are generated by incident photons hν and multiplied by the diodes 73 to be detected by the anode 74.

In the image intensifier of FIG. 13, the photo-electron-emitting cathode 72 is secured to the front opening of a cylindrical bulb 81, and an output face plate 82 of glass with a fluorescent film 83 applied to the inside surface is secured to the inside surface of a rear opening. A microchannel plate 84 having the electron multiplying function is provided inside the image intensifier tube. This electron tube can augment a feeble light image to an intensified light image. In the case that the photo-electron-emitting cathode 72 is built in a vacuum vessels as in FIGS. 12 and 13, it is necessary that the photoemitting cathodes 72 are atmospheric pressure resistant. These photo-electron-emitting cathodes are prepared by using a GaAlAs substrate as a support, growing an epitaxial layer as a photosensitive layer on the substrate, and forming a mesh electrode on the top surface of the epitaxial layer. Needless to say, an InGaAs layer may be epitaxially grown on an InP substrate.

As described above, according to this invention, a Schottky electrode for applying a bias voltage is formed in a pattern, whereby the Schottky electrode is stable and heat-resistant with high reproducibility. In comparison with the conventional semiconductor photo-electron-emitting device having a thin film Schottky electrode, the semiconductor photoemitting device according to this invention has increased optical transmission of incident photons on the semiconductor, and increased emission probability of the generated photoelectron into a vacuum. Furthermore, the semiconductor photo-electron-emitting device according to this invention can be fabricated with high reproducibility.

From the invention thus described, it will be obvious that the invention may be varied in many ways. Such variations are not to be regarded as a departure from the spirit and scope of the invention, and all such modifications, as would be obvious to one skilled in the art, are intended to be included within the scope of the following claims.

We claim:

1. A semiconductor photo-electron-emitting device for emitting photoelectrons excited from a valence band to a conduction band as a result of incident photons, comprising:

a semiconductor layer having at least one concavity surface and one convexity surface on a first side;

a first conductor layer provided on the concavity surface, the first conductor layer having an emitting surface for emitting photoelectrons;

an electrode provided on the convexity surface, the electrode having a pattern exposing the emitting surface in a substantially uniform manner; and a second conductor layer provided on a second side of the semiconductor layer opposite to the first side, the electrode and the second conductor layer being adapted to accept a bias voltage between them to cause excited photoelectrons to be transferred to the emitting surface.

2. A semiconductor photo-electron-emitting device according to claim 1, wherein the electrode is formed in a planar line pattern.

3. A semiconductor photo-electron-emitting device according to claim 2, wherein the planar line pattern is a mesh pattern.

4. A semiconductor photo-electron-emitting device according to claim 2, wherein the planar line pattern is a striped pattern.

5. A semiconductor photo-electron-emitting device according to claim 2, wherein the planar line pattern is a concentric circular pattern.

6. A semiconductor photo-electron-emitting device according to claim 1, wherein the first conductor layer is selected from the group consisting of an alkali metal, an alkali metal oxide, and an alkali metal alloy.

7. A semiconductor photo-electron-emitting device according to claim 1, wherein the first conductive layer is selected from the group consisting of Cs, Rb, K, Na, oxides thereof an alloys thereof.

8. A semiconductor photo-electron-emitting device according to claim 1, wherein the first conductive layer is selected from the group consisting of $Cs_2O$ and CsF.

9. A semiconductor photo-electron-emitting device according to claim 1, wherein the photoelectrons are transferred from an energy band of a smaller effective mass to an energy band of a larger effective mass.

10. A semiconductor photo-electron-emitting device according to claim 1, wherein the semiconductor layer is formed of a III–V compound semiconductor.

11. A semiconductor photo-electron-emitting device according to claim 1, wherein the semiconductor layer and the electrode are in Schottky contact with one another.

12. A semiconductor photo-electron-emitting device according to claim 1, wherein the electrode is formed from the group consisting of Al, Ag, Au, Pt, Ni, Cr, W, WSi and alloys thereof.

13. A semiconductor photo-electron-emitting device according to claim 2, wherein the electrode has a thickness equal to or larger than 100 Å.

14. A semiconductor photo-electron-emitting device according to claim 2, wherein a line width of the electrode is equal to or smaller than 10 $\mu$m, and an interval between each line and an adjacent one is equal to or smaller than 100 $\mu$m.

15. A semiconductor photo-electron-emitting device according to claim 1, wherein the second conductor layer is a metal layer which is in ohmic contact with the semiconductor layer.

16. A semiconductor photo-electron-emitting device according to claim 1, wherein the second conductor layer is formed of a heavily-doped semiconductor substrate with a bandgap heterojuncture to the semiconductor layer.

17. A semiconductor photo-electron-emitting device according to claim 15, further comprising:

vessel means for containing the layers and the electrode in a vacuum, the vessel means having a window so that photons can enter the vessel and be incident on the first conductor layer; and multiplying means for secondary electron multiplying of the emitted photoelectrons.

18. A semiconductor photo-electron-emitting device according to claim 16, further comprising:

vessel means for containing the layers and the electrode in a vacuum, the vessel means having a window so that photons can enter the vessel and be incident on the layers; and multiplying means for secondary electron multiplying of the emitted photoelectrons.

* * * * *

UNITED STATES PATENT AND TRADEMARK OFFICE

CERTIFICATE OF CORRECTION

PATENT NO. : 5,336,902

DATED : August 9, 1994

INVENTOR(S) : Nigaki et al

It is certified that error appears in the above-indentified patent and that said Letters Patent is hereby corrected as shown below:

Column 6, lines 42 and 51, change "diodes" to --dynodes --.

Signed and Sealed this

Sixteenth Day of May, 1995

Attest:

BRUCE LEHMAN

*Attesting Officer*

*Commissioner of Patents and Trademarks*